(12) United States Patent
Chen

(10) Patent No.: US 7,212,457 B2
(45) Date of Patent: May 1, 2007

(54) METHOD AND APPARATUS FOR IMPLEMENTING HIGH SPEED MEMORY

(75) Inventor: Chang-Ting Chen, Hsinchu (TW)

(73) Assignee: Macronix International Co., Ltd., Hsinchu (TW)

(*) Notice: Subject to any disclaimer, the term of this patent is extended or adjusted under 35 U.S.C. 154(b) by 10 days.

(21) Appl. No.: 11/131,580

(22) Filed: May 18, 2005

(65) Prior Publication Data

US 2006/0262616 A1 Nov. 23, 2006

(51) Int. Cl.
 *G11C 7/00* (2006.01)
(52) U.S. Cl. ............ 365/203; 365/189.01; 365/230.03
(58) Field of Classification Search ................ 365/203, 365/189.01, 230.03
See application file for complete search history.

(56) References Cited

U.S. PATENT DOCUMENTS

| | | | |
|---|---|---|---|
| 5,885,870 A | 3/1999 | Maiti et al. | |
| 6,228,779 B1 | 5/2001 | Bloom et al. | |
| 6,327,209 B1 * | 12/2001 | Schaefer | 365/203 |
| 6,380,033 B1 | 4/2002 | He et al. | |
| 6,413,881 B1 | 7/2002 | Aronowitz et al. | |
| 6,417,570 B1 | 7/2002 | Ma et al. | |
| 6,559,007 B1 | 5/2003 | Weimer | |
| 6,684,352 B1 * | 1/2004 | Pendurkar | 714/718 |
| 2004/0003195 A1 | 1/2004 | Takahashi et al. | |
| 2004/0006658 A1 | 1/2004 | Chae et al. | |

* cited by examiner

*Primary Examiner*—Huan Hoang
(74) *Attorney, Agent, or Firm*—Kenta Suzue; Haynes Beffel & Wolfeld LLP

(57) ABSTRACT

Various methods and apparatuses permit high speed reads of memory. Portions of data are copied and stored on other word lines. By reading a copy of data that is stored on memory cells accessed by a word line that is already precharged, a latency specification can be met which does not allow time for precharging a second word line.

48 Claims, 5 Drawing Sheets

METHOD AND APPARATUS FOR IMPLEMENTING HIGH SPEED MEMORY

BACKGROUND OF THE INVENTION

1. Field of the Invention

The invention relates to reading memory at high speed, and in particular to memory that copies data between multiple word lines.

2. Description of Related Art

The improving performance specifications of memory integrated circuits includes a decreasing latency requirement. As a result, during the brief time of the maximum allowed latency period, it may not be possible to read the data in time if two word lines must be precharged to read data stored on memory cells accessed by separate word lines. Thus, there exists a need to read data stored on memory cells read by separate word lines, without suffering an additional latency penalty suffered by precharging another word line.

SUMMARY OF THE INVENTION

Various embodiments of the present invention are directed to a memory and a method for operating the memory.

Various types of data are stored on memory cells coupled to a first word line and a second word line. When the contents of these memory cells are read, for example in a burst read mode with a short latency period requirement, rather than suffering a latency period caused by waiting for a subsequent word line to precharge, a copy of data is read from memory cells on the currently precharged word line. With respect to these two word lines, at least three types of data are stored: 1) copied data stored at least as a first copy on memory cells coupled to the first word line and as a second copy on memory cells coupled to the second word line, 2) other data (besides the coped data) stored on memory cells coupled to the first word line, and 3) other data (besides the copied data) stored on memory cells coupled to the second word line.

In one embodiment, in response to a command to read data, after precharging the first word line, the other data (besides the copied data) stored on memory cells coupled to the first word line is read. Prior to a voltage of the second word line reaching a precharged state, the copied data is read from memory cells coupled to the first word line. By reading this copy rather than the copy on the memory cells coupled to the second word line, the latency period does not have to suffer the extra time of precharging the second word line. As this copied data is read, precharging of the second word line can finish. After the voltage of the second word line reaches the precharged state, the other data (besides the coped data) stored on memory cells coupled to the second word line is read.

In another embodiment, the first or the second copy of the copied data is read, depending on the location of the beginning address specified in the read command. If the read command specifies a beginning address located by an end of a data page stored on the memory cells coupled to the first word line, then the first copy of the copied data (stored on the memory cells coupled to the first word line) is read. If the read command specifies a beginning address located farther from the end of the data page than the other beginning address, then the second copy of the copied data stored on memory cells coupled to the second word line is read.

DETAILED DESCRIPTION

Figure 1:
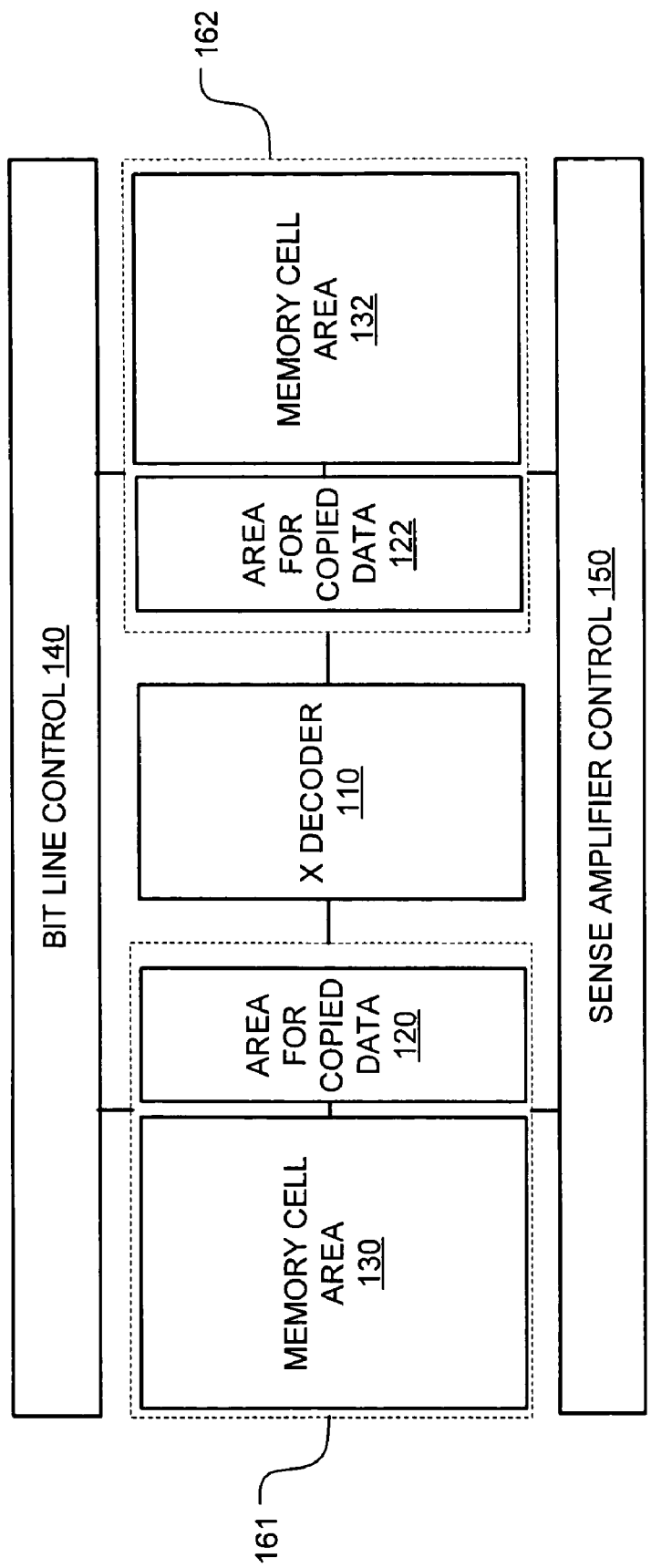
FIG. 1 is a simplified diagram of a high speed memory architecture with memory arrays that include an area for copied data.

FIG. 1 is a simplified diagram of a high speed memory architecture having multiple read modes, such as a high speed burst mode. A bit line control 140 drives bit lines in the high speed memory. An x decoder 110 drives the word lines in the high speed memory. A sense amplifier control 150 includes sense amplifier and related control circuitry to sense the stored data. Two memory arrays 161 and 162 are shown. Splitting the memory cells into multiple memory arrays such as memory arrays 161 and 162 shortens each of the word lines. The overall capacitance of each word line is decreased to the fewer memory cells driven by each word line. The lower capacitance associated with each word line permits a shorter precharge time taken by a word line driver to change the voltage of a word line to a read voltage. Other embodiments use an architecture that simply includes memory cells in a single array, which lengthens the word line precharge time, but simplifies the design, for example the x decoder 110. Each of the memory arrays 161 and 162 has, in addition to a regular memory cell area, a memory cell area that stores copied data. The copied data area stores a copy of data that is also stored in the regular memory cell area. For example, in memory array 161, the area for copied data 120 stores data that is also stored in the memory cell area 130. Also, in memory array 162, the area for copied data 122 stores data that is also stored in the memory cell area 132.

Figure 2:
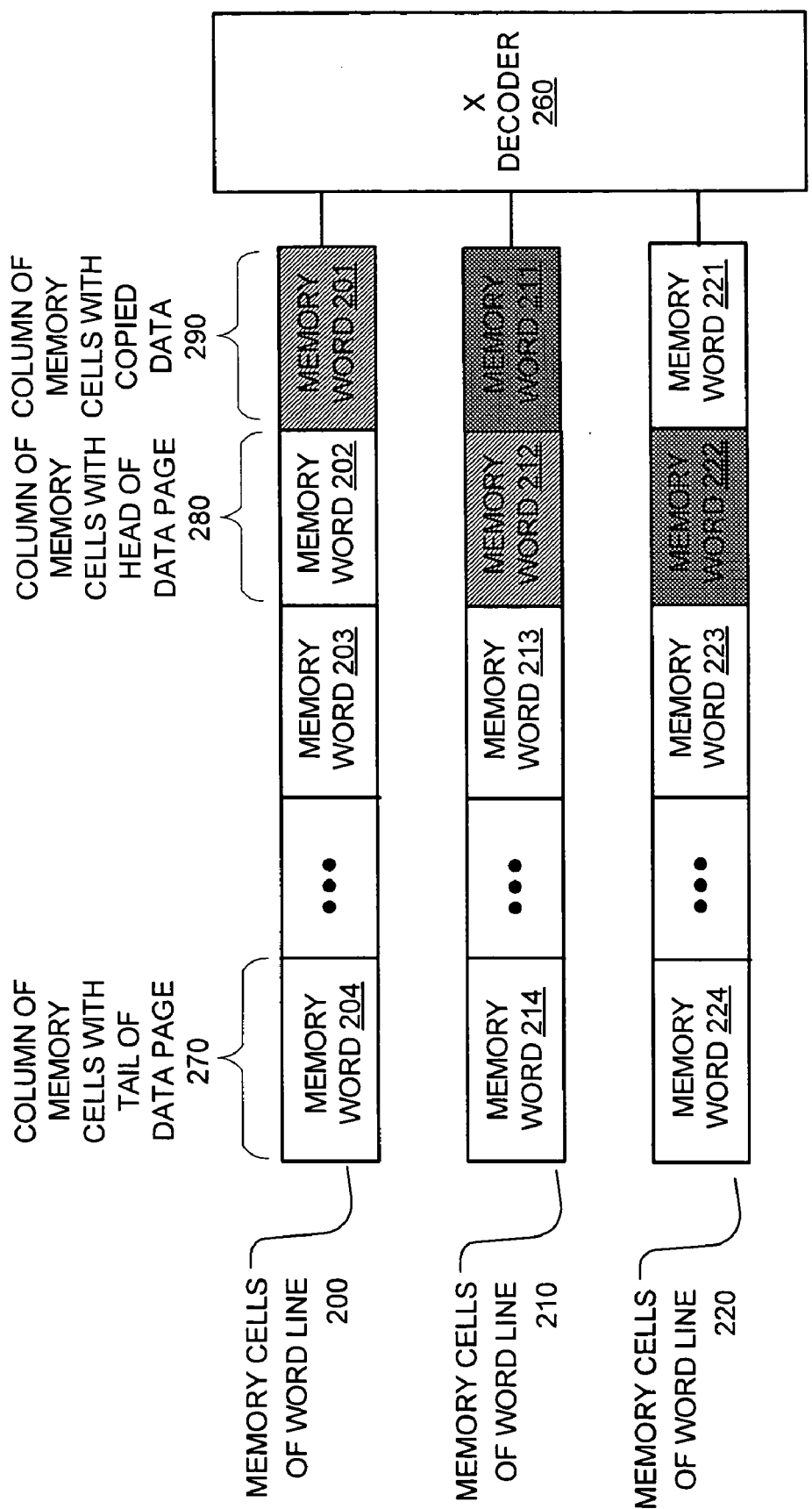
FIG. 2 is a simplified diagram of a memory array with a column of memory cells with copied data.

FIG. 2 is a simplified diagram of a memory array, such as memory array 161 or 162. The x decoder 260 drives multiple word lines, each of which provides a gate voltage to multiple cells. In particular, the x decoder 260 drives word lines that respectively provide a gate voltage to memory cells of word line 200, memory cells of word line 210, and memory cells of word line 220. Each row of memory cells is accessed in blocks of multiple bits, such as a word size. The memory cells of word line 200 include memory word 201, memory word 202, memory word 203, and memory word 204. The memory cells of word line 210 include memory word 211, memory word 212, memory word 213, and memory word 214. The memory cells of word line 220 include memory word 221, memory word 222, memory word 223, and memory word 224.

The memory cells controlled by each word line collectively store a page of data. The head of each data page is stored by the x decoder 260, in a column of memory cells with the head of a data page 280. For example, memory word 202 stores the head of the data page stored by memory cells of word line 200. Memory word 212 stores the head of the data page stored by memory cells of word line 210.

Memory word 222 stores the head of the data page stored by memory cells of word line 220. Similarly, the tail of each data page is stored away from the x decoder 260, in a column of memory cells with the tail of a data page 270. For example, memory word 204 stores the tail of the data page stored by memory cells of word line 200. Memory word 214 stores the tail of the data page stored by memory cells of word line 210. Memory word 224 stores the tail of the data page stored by memory cells of word line 220. The terms "head" and "tail" refer to the order in which memory words are accessed when a large block of data is read as explained in connection with other figures, and depends on the behavior of the scramble table which decodes logical memory addresses into physical memory cell locations. In other embodiments, the head and tail of each memory page are located in other locations along the memory cells of a particular word line. For example, the head may be positioned in the middle or away from the x decoder, and the tail may be positioned in the middle or by the x decoder.

The memory cells which store copied data are in a column of memory cells with copied data 290. The copied data in these memory cells is redundant with data also stored elsewhere on a different word line, such as the head of the data page stored on the following word line. For example, memory word 201 stores a copy of data that is also stored as memory word 212, symbolically shown by the background pattern common to those memory words. Memory word 211 stores a copy of data that is also stored as memory word 222, symbolically shown by another background common to those memory words. Although the memory cells which store copied data are shown to be one memory word long (for example, 16 bits) in each group of memory cells accessed per word line, in other embodiments, some other number of bits are copied, such as multiple words or a fraction of a word.

In some embodiments, the copied data are programmed as follows. When the programming logic determines that data are to be programmed to the head of memory cells of a word line, then the data are also programmed to the area for copied data (e.g., in the column of memory cells with copied data) in the prior word line. Thus, when the programming logic determines that data are to be programmed as memory word 212 in memory cells of word line 210, the same data are programmed as memory word 201 in memory cells of word line 200. Similarly, when the programming logic determines that data are to be programmed as memory word 222 in memory cells of word line 220, the same data are programmed as memory word 211 in memory cells of word line 210. The actual sequence of programming the copied data is varied in different embodiments. For example, memory word 201 may be programmed before, after, or simultaneously with memory word 212, and memory word 211 may be programmed before, after, or simultaneously with memory word 222. The determination that the position of the copied data occurs at the head of a memory page may occur before, after, or simultaneously with programming the copied data.

Figure 3:
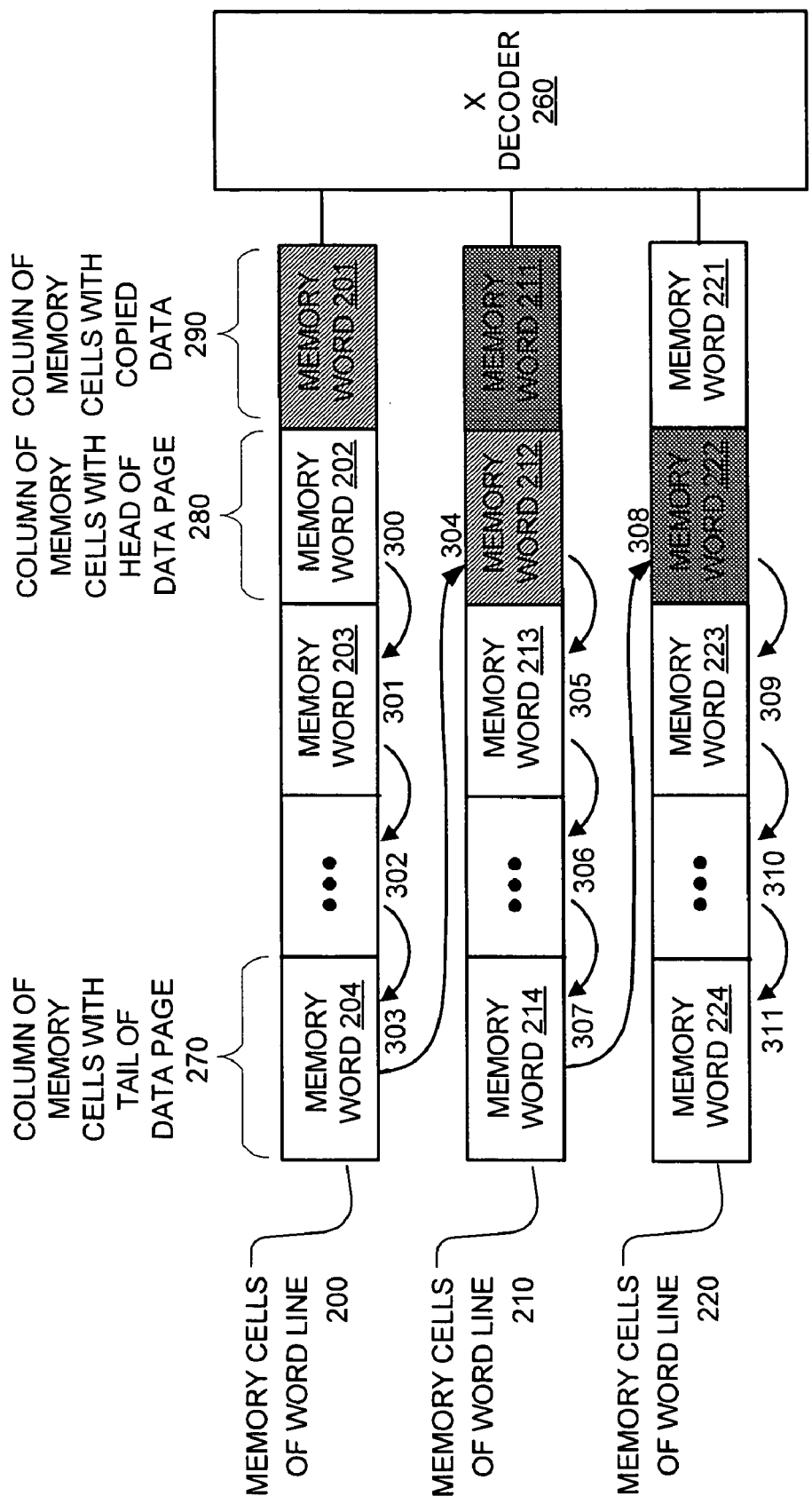
FIG. 3 shows an order for reading memory words when the beginning memory address is not by the end of a memory page.
Figure 4:
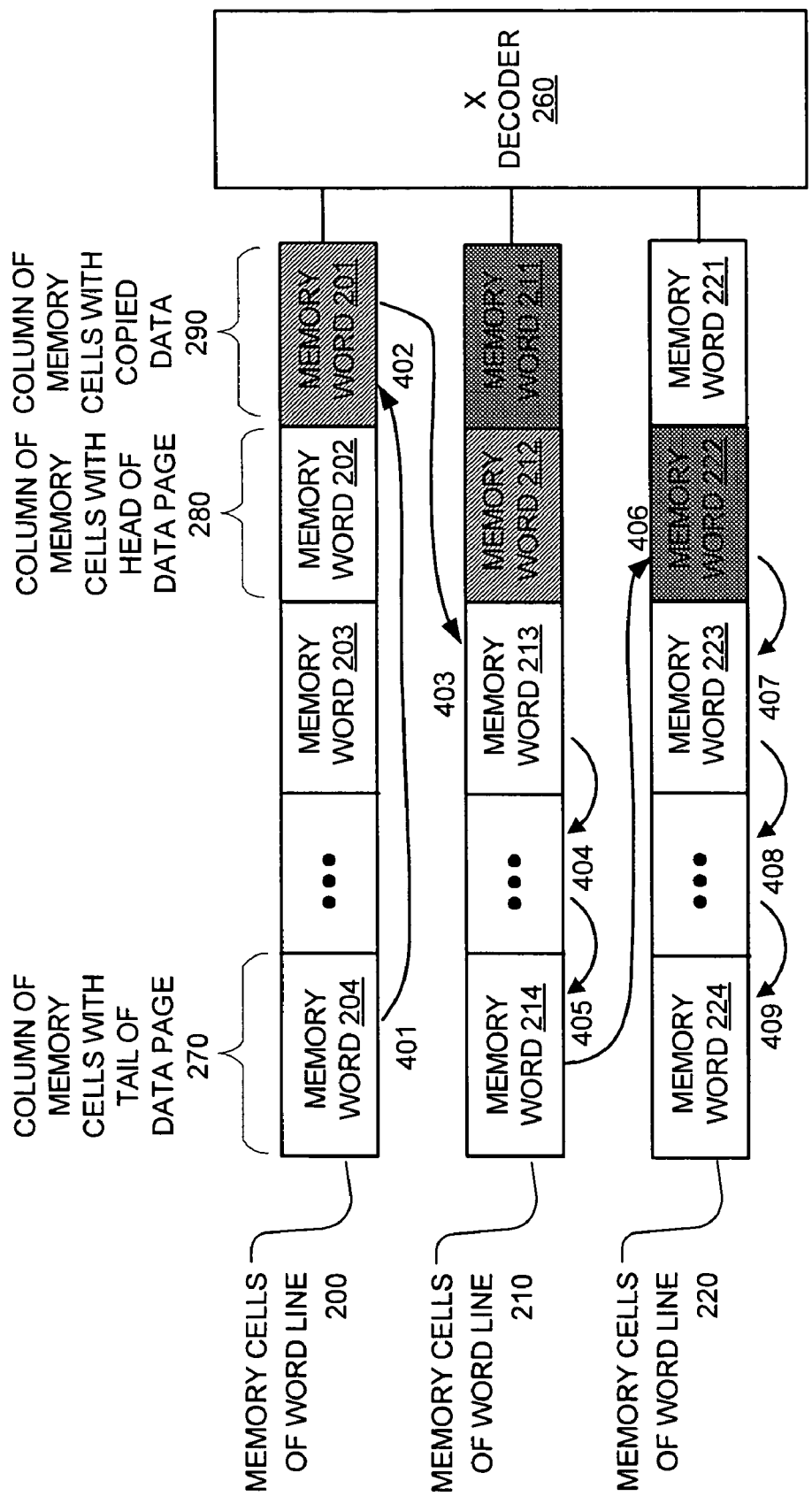
FIG. 4 shows an order for reading memory words when the beginning memory address is by the end of a memory page.

FIG. 3 and FIG. 4 illustrate alternative scenarios in which the different copies of the same data are read, depending on the circumstances of the read command. FIG. 3 illustrates a scenario in which the copy stored in the regular memory cell area is read. FIG. 4 illustrates a scenario in which the copy stored in the area for copied data is read. A difference between the scenarios of FIG. 3 and FIG. 4 is the location of the beginning address specified in the read command. If the beginning address is located by the end of a data page, then the scenario of FIG. 3 follows. If the beginning address is located further from the end of a data page, then the scenario of FIG. 4 follows. Although FIG. 3 shows a beginning address at the beginning of a data page and FIG. 4 shows a beginning address at the end of a data page, these are extreme cases. Other embodiments follow the scenario of FIG. 3 even with a beginning address further from the beginning of the data page, and/or follow the scenario of FIG. 4 even with a beginning address further from the end of the page (and remain "by" the end of the page), depending on the latency specification of the memory integrated circuit.

FIG. 3 shows the order in which memory words are read in response to a command to read data from the memory cells of word line 200, the memory cells of word line 210, and the memory cells of word line 220. The command specifies a beginning address corresponding to the head of the data page stored on the memory cells of word line 200, or memory word 202. Consequently, the first memory word that is read is memory word 202, as shown by position 300. Subsequently, the memory words are read proceeding from the head to the tail of the memory cells of word line 200. Thus, position 301 indicates that memory word 203 is read, position 302 indicates that other memory words prior to the tail are read, and finally position 303 indicates that memory word 204 is read.

Next, the data page stored on the memory cells of word line 210 are read, proceeding from the head to the tail of the memory page. Thus, position 304 indicates that memory word 212 (storing a copy of the data stored at memory word 201) is read, position 305 indicates that memory word 213 is read, position 306 indicates that memory words prior to the tail are read, and finally position 307 indicates that memory word 214 is read.

Similarly, the data page stored on the memory cells of word line 220 are read, proceeding from the head to the tail of the memory page. Thus, position 308 indicates that memory word 222 is read, position 309 indicates that memory word 223 is read, position 310 indicates that memory words prior to the tail are read, and finally position 311 indicates that memory word 224 is read.

FIG. 4 shows the order in which memory words are read in response to another command to read data from the memory cells of word line 200, the memory cells of word line 210, and the memory cells of word line 220. The command specifies a beginning address corresponding to the tail of the data page stored on the memory cells of word line 200, or memory word 202. Consequently, the first memory word that is read is memory word 204, as shown by position 401.

Unlike the scenario shown in FIG. 3, the memory word 212 is not the next word read. The latency specification of the memory may be too brief to allow time for the precharging of two word lines. Prior to reading any of the memory cells of word line 200, this first word line was precharged to a read voltage. However, prior to reading any of the memory cells of word line 210, this second word line also must be precharged to a read voltage. Thus, to save the time it would take to precharge this second word line, rather than reading memory word 212 which belongs to the memory cells of word line 210, memory word 201 is read which stores a copy of the data stored by memory word 212 as indicated by position 402. The time taken to read memory word 201 can permit the completion of precharging for the word line which accesses memory cells of word line 210.

Subsequently, the memory words are read proceeding towards the tail of the memory cells of word line 210. Thus, position 403 indicates that memory word 213 is read, position 404 indicates than other memory words prior to the tail are read, and finally position 405 indicates that memory word 214 is read.

As in the prior scenario, the data page stored on the memory cells of word line 220 are read, proceeding from the head to the tail of the memory page. Thus, position 406 indicates that memory word 222 is read, position 407 indicates that memory word 223 is read, position 408 indicates that memory words prior to the tail are read, and finally position 409 indicates that memory word 224 is read.

Figure 5:
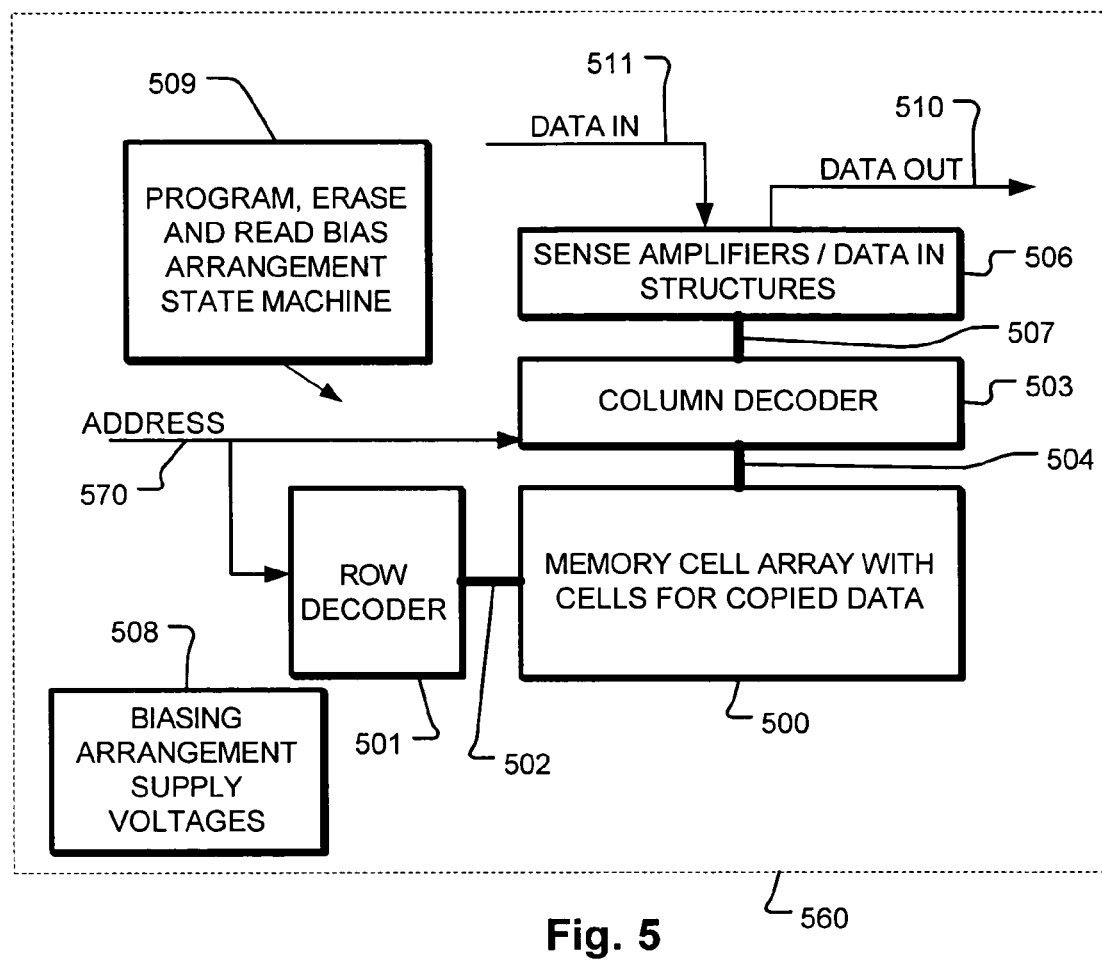
FIG. 5 is a simplified diagram of an integrated circuit with a high speed memory architecture.

FIG. 5 is a simplified block diagram of an integrated circuit according to an embodiment. The integrated circuit 560 includes a memory array 500 implemented with memory cells for copied data, on a semiconductor substrate. A row decoder 501 is coupled to a plurality of word lines 502 arranged along rows in the memory array 500. A column decoder 503 is coupled to a plurality of bit lines 504 arranged along columns in the memory array 500. Addresses are supplied on bus 570 to column decoder 503 and row decoder 501. Sense amplifiers and data-in structures in block 506 are coupled to the column decoder 503 via data bus 507. Data is supplied via the data-in line 511 from input/output ports on the integrated circuit 560, or from other data sources internal or external to the integrated circuit 560, to the data-in structures in block 506. Data is supplied via the data-out line 510 from the sense amplifiers in block 506 to input/output ports on the integrated circuit 560, or to other data destinations internal or external to the integrated circuit 560. A bias arrangement state machine 509 controls the application of bias arrangement supply voltages 508, such as for the erase verify and program verify voltages, and the arrangements for programming multiple selected cells, erasing, and reading the memory cells.

The integrated circuit of FIG. 5 complies with the Serial Peripheral Interface (SPI) standard for synchronous serial data links across many microprocessors and peripheral chips such as memory chips. The SPI-bus is a 4-wire serial communications interface. The SPI bus is a relatively simple synchronous serial interface for connecting external devices using a low number of wires. A synchronous clock shifts serial data into and out of the microcontrollers in blocks of bits, such as 8 bit blocks.

The SPI bus is a master/slave interface, where the master drives the serial clock. When using SPI, data is simultaneously transmitted and received, making it a full-duplexed protocol. The signals are as follows: a serial clock driven by the master, master-in slave-out data, and master-out slave-in data. A chip-select input enables the IC.

Command codes as well as data values are serially transferred, pumped into a shift register, and are then internally available for parallel processing. Typically, the shift registers are 8 bit or other integral multiples. If an SPI device is not selected, its data output goes into a high-impedance state (hi-Z), so that it does not interfere with the currently activated devices. The data sheets of the component specify the permitted clock frequencies and the type of valid transitions, and transitions where data should be latched. Various SPI modes specify the phase of the clock and whether the data is latched at the rising or falling edge of the clock. Two modes commonly used with memory read operations are continuous read mode and page read mode.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A method of operating an integrated circuit array of memory cells receiving a gate voltage from at least a first word line and a second word line to read 1) copied data stored at least as a first copy on memory cells coupled to the first word line and as a second copy on memory cells coupled to the second word line, 2) other data stored on memory cells coupled to the first word line, and 3) other data stored on memory cells coupled to the second word line, comprising:
    in response to a command to read data:
        reading the other data stored on memory cells coupled to the first word line;
        prior to a voltage of the second word line reaching a precharged state, reading the first copy of the copied data from memory cells coupled to the first word line, wherein the second copy of the copied data is stored on memory cells coupled to the second word line; and
        after the voltage of the second word line reaches the precharged state, reading the other data stored on memory cells coupled to the second word line.

2. The method of claim 1, wherein the first word line and the second word line are coupled to a same decoder.

3. The method of claim 1, wherein the second copy of the copied data is stored at a beginning of a data page stored on the memory cells coupled to the second word line.

4. The method of claim 1, wherein the first copy of the copied data is stored on the memory cells coupled to the first word line proximate to a decoder.

5. The method of claim 1, wherein the second copy of the copied data is stored on the memory cells coupled to the second word line proximate to a decoder.

6. The method of claim 1, wherein in response to the command to read data, the second copy of the copied data is not read.

7. The method of claim 1, further comprising in response to the command to read data:
    wherein, at least partly during said reading the first copy of the copied data, changing the voltage of the second word line to the precharged state.

8. The method of claim 1, wherein a latency specification is met for said command to read data in burst read mode.

9. The method of claim 1, wherein the integrated circuit array meets a Serial Peripheral Interface standard.

10. The method of claim 1, wherein the copied data has a size of one word of data.

11. The method of claim 1, wherein the command to read data specifies data having a beginning address located by an end of a data page stored on the memory cells coupled to the first word line.

12. The method of claim 1, further comprising:
    in response to a command to program the copied data at least as the first copy on memory cells coupled to the first word line and as the second copy on memory cells coupled to the second word line:
        determining that programming the copied data results in a position of the copied data at a beginning of a memory page stored on memory cells coupled to the second word line;
        programming the copied data as the first copy on memory cells coupled to the first word line; and programming the copied data as the second copy at the beginning of the memory page stored on memory cells coupled to the second word line.

13. A method of operating an integrated circuit array of memory cells receiving a gate voltage from at least a first word line and a second word line to read 1) copied data stored at least as a first copy on memory cells coupled to the first word line and as a second copy on memory cells coupled to the second word line, 2) other data stored on memory cells coupled to the first word line, and 3) other data stored on memory cells coupled to the second word line, comprising:

reading the first copy of the copied data stored on memory cells coupled to the first word line, in response to a first command to read a first group of data having a first beginning address located by an end of a data page stored on the memory cells coupled to the first word line; and reading the second copy of the copied data stored on memory cells coupled to the second word line, in response to a second command to read a second group of data having a second beginning address located farther from the end of the data page than the first beginning address.

14. The method of claim 13, wherein said reading the first copy occurs prior to a voltage of the second word line reaching a precharged state.

15. The method of claim 13, wherein the first word line and the second word line are coupled to a same decoder.

16. The method of claim 13, wherein the second copy of the copied data is stored at a beginning of a data page stored on the memory cells coupled to the second word line.

17. The method of claim 13, wherein the first copy of the copied data is stored on memory cells coupled to the first word line proximate to a decoder.

18. The method of claim 13, wherein the second copy of the copied data is stored on the memory cells coupled to the second word line proximate to a decoder.

19. The method of claim 13, wherein, in response to the first command to read the first group of data, the second copy of the copied data is not read.

20. The method of claim 13, wherein in response to the first command to read the first group of data, a voltage of the second word line is changed to a precharged state; and the voltage of the second word line is changing to the precharged state at least partly during said reading the first copy of the copied data.

21. The method of claim 13, wherein the first group of data includes the other data stored on memory cells coupled to the second word line, and a latency specification is met for said first command to read: 1) copied data stored at least as a first copy on memory cells coupled to the first word line and as a second copy on memory cells coupled to the second word line, 2) other data stored on memory cells coupled to the first word line, and 3) other data stored on memory cells coupled to the second word line.

22. The method of claim 13, wherein the integrated circuit array meets a Serial Peripheral Interface standard.

23. The method of claim 13, wherein the copied data has a size of one word of data.

24. The method of claim 13, further comprising:

in response to a command to program the copied data at least as the first copy on memory cells coupled to the first word line and as the second copy on memory cells coupled to the second word line:

determining that programming the copied data results in a position of the copied data at a beginning of a memory page stored on memory cells coupled to the second word line;

programming the copied data as the first copy on memory cells coupled to the first word line; and programming the copied data as the second copy at the beginning of the memory page stored on memory cells coupled to the second word line.

25. An integrated circuit, comprising:

an array of memory cells arranged in rows and columns;

a plurality of word lines coupled to the rows of memory cells, each of the word lines providing a gate voltage to the memory cells in one of the rows, the plurality of word lines including a first word line and a second word line providing a voltage at least to read 1) copied data stored at least as a first copy on memory cells coupled to the first word line and as a second copy on memory cells coupled to the second word line, 2) other data stored on memory cells coupled to the first word line, and 3) other data stored on memory cells coupled to the second word line; and controller circuitry coupled to the plurality of word lines, the controller circuitry performing in response to a command to read data:

reading the other data stored on memory cells coupled to the first word line;

prior to the voltage of the second word line reaching a precharged state, reading the first copy of the copied data from memory cells coupled to the first word line; and after the voltage of the second word line reaches the precharged state, reading the other data stored on memory cells coupled to the second word line.

26. The circuit of claim 25, further comprising:

a decoder coupled to the first word line and the second word line.

27. The circuit of claim 25, wherein the second copy of the copied data is stored at a beginning of a data page stored on memory cells coupled to the second word line.

28. The circuit of claim 25, further comprising:

a decoder coupled to at least the first word line, and the first copy of the copied data is stored on memory cells coupled to the first word line proximate to the decoder.

29. The circuit of claim 25, further comprising:

a decoder coupled to at least the second word line, and the second copy of the copied data is stored on memory cells coupled to the second word line proximate to the decoder.

30. The circuit of claim 25, wherein in response to the command to read data, the second copy of the copied data is not read.

31. The circuit of claim 25, wherein the controller circuitry further performs in response to the command to read data:

at least partly during said reading the first copy of the copied data, changing the voltage of the second word line to the precharged state.

32. The circuit of claim 25, wherein a latency specification is met for said command to read data in burst read mode.

33. The circuit of claim 25, wherein the integrated circuit array meets a Serial Peripheral Interface standard.

34. The circuit of claim 25, wherein the copied data has a size of one word of data.

35. The circuit of claim 25, wherein the command to read data specifies data having a beginning address located by an end of a data page stored on the memory cells coupled to the first word line.

36. The circuit of claim 25, wherein the controller circuitry further performs:
in response to a command to program the copied data at least as the first copy on memory cells coupled to the first word line and as the second copy on memory cells coupled to the second word line:
determining that programming the copied data results in a position of the copied data at a beginning of a memory page stored on memory cells coupled to the second word line;
programming the copied data as the first copy on memory cells coupled to the first word line; and
programming the copied data as the second copy at the beginning of the memory page stored on memory cells coupled to the second word line.

37. An integrated circuit, comprising:
an array of memory cells arranged in rows and columns;
a plurality of word lines coupled to the rows of memory cells, each of the word lines providing a gate voltage to the memory cells in one of the rows, the plurality of word lines including a first word line and a second word line providing a voltage at least to read 1) copied data stored at least as a first copy on memory cells coupled to the first word line and as a second copy on memory cells coupled to the second word line, 2) other data stored on memory cells coupled to the first word line, and 3) other data stored on memory cells coupled to the second word line; and
controller circuitry coupled to the plurality of word lines, the controller circuitry performing:
reading the first copy of the copied data stored on memory cells coupled to the first word line, in response to a first command to read a first group of data having a first beginning address located by an end of a data page stored on the memory cells coupled to the first word line; and
reading the second copy of the copied data stored on memory cells coupled to the second word line, in response to a second command to read a second group of data having a second beginning address located further from the end of the data page than the first beginning address.

38. The circuit of claim 37, wherein said reading the first copy occurs prior to a voltage of the second word line reaching a precharged state.

39. The circuit of claim 37, further comprising:
a decoder coupled to the first word line and the second word line.

40. The circuit of claim 37, wherein the second copy of the copied data is stored at a beginning of a data page stored on the memory cells coupled to the second word line.

41. The circuit of claim 37, further comprising:
a decoder coupled to at least the first word line, and the first copy of the copied data is stored on memory cells coupled to the first word line proximate to the decoder.

42. The circuit of claim 37, further comprising:
a decoder coupled to at least the second word line, and the second copy of the copied data is stored on memory cells coupled to the second word line proximate to the decoder.

43. The circuit of claim 37, wherein, in response to the first command to read the first group of data, the second copy of the copied data is not read.

44. The circuit of claim 37, wherein in response to the first command to read the first group of data, a voltage of the second word line is changed to a precharged state; and the voltage of the second word line is changing to the precharged state at least partly during said reading the first copy of the copied data.

45. The circuit of claim 37, wherein the first group of data includes the other data stored on memory cells coupled to the second word line, and a latency specification is met for said first command to read: 1) copied data stored at least as a first copy on memory cells coupled to the first word line and as a second copy on memory cells coupled to the second word line, 2) other data stored on memory cells coupled to the first word line, and 3) other data stored on memory cells coupled to the second word line.

46. The circuit of claim 37, wherein the integrated circuit array meets a Serial Peripheral Interface standard.

47. The circuit of claim 37, wherein the copied data has a size of one word of data.

48. The circuit of claim 37, wherein the controller circuitry further performs:
in response to a command to program the copied data at least as the first copy on memory cells coupled to the first word line and as the second copy on memory cells coupled to the second word line:
determining that programming the copied data results in a position of the copied data at a beginning of a memory page stored on memory cells coupled to the second word line;
programming the copied data as the first copy on memory cells coupled to the first word line; and
programming the copied data as the second copy at the beginning of the memory page stored on memory cells coupled to the second word line.

* * * * *